United States Patent
Liao et al.

(10) Patent No.: US 8,647,953 B2
(45) Date of Patent: Feb. 11, 2014

(54) METHOD FOR FABRICATING FIRST AND SECOND EPITAXIAL CAP LAYERS

(75) Inventors: Chin-I Liao, Tainan (TW); I-Ming Lai, Kaohsiung (TW); Chin-Cheng Chien, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 176 days.

(21) Appl. No.: 13/299,044

(22) Filed: Nov. 17, 2011

(65) Prior Publication Data

US 2013/0126949 A1     May 23, 2013

(51) Int. Cl.
H01L 21/336     (2006.01)

(52) U.S. Cl.
USPC ............................................ 438/300; 257/19

(58) Field of Classification Search
USPC .............. 257/19, 51, 371, 190, 288; 438/509, 438/299, 300
See application file for complete search history.

(56) References Cited

U.S. PATENT DOCUMENTS

| | | |
|---|---|---|
| 4,891,303 A | 1/1990 | Garza et al. |
| 5,217,910 A | 6/1993 | Shimizu et al. |
| 5,273,930 A | 12/1993 | Steele et al. |
| 5,356,830 A | 10/1994 | Yoshikawa et al. |
| 5,372,957 A | 12/1994 | Liang et al. |
| 5,385,630 A | 1/1995 | Philipossian et al. |
| 5,399,506 A | 3/1995 | Tsukamoto |
| 5,625,217 A | 4/1997 | Chau et al. |
| 5,777,364 A | 7/1998 | Crabbe et al. |
| 5,783,478 A | 7/1998 | Chau et al. |
| 5,783,479 A | 7/1998 | Lin et al. |
| 5,960,322 A | 9/1999 | Xiang et al. |
| 6,030,874 A | 2/2000 | Grider et al. |
| 6,048,756 A | 4/2000 | Lee et al. |
| 6,074,954 A | 6/2000 | Lill et al. |
| 6,100,171 A | 8/2000 | Ishida |
| 6,110,787 A | 8/2000 | Chan et al. |
| 6,165,826 A | 12/2000 | Chau et al. |
| 6,165,881 A | 12/2000 | Tao et al. |
| 6,191,052 B1 | 2/2001 | Wang |
| 6,228,730 B1 | 5/2001 | Chen et al. |
| 6,274,447 B1 | 8/2001 | Takasou |
| 6,355,533 B2 | 3/2002 | Lee |
| 6,365,476 B1 | 4/2002 | Talwar et al. |

(Continued)

OTHER PUBLICATIONS

U'Ren et al., "Influence of misfit strain on {311} facet development in selective epitaxial growth of Si1-xGex/Si(100) grown by gas-source molecular beam epitaxy", Thin Solid Films, vol. 365, Issue 1, Apr. 3, 2000, pp. 147-150.*

*Primary Examiner* — Thomas L Dickey
(74) *Attorney, Agent, or Firm* — J.C. Patents

(57) ABSTRACT

A method for fabricating a metal oxide semiconductor (MOS) device is described, including following steps. Two recesses are formed in a substrate. A first epitaxy growth process is performed, so as to form a first semiconductor compound layer in each of the recesses. A second epitaxy growth process is performed with an epitaxial temperature lower than 700° C., so as to form a cap layer on each of the first semiconductor compound layers. Each of the cap layers includes a second semiconductor compound layer protruding from a surface of the substrate. The first and the second semiconductor compound layers are composed of a first Group IV element and a second Group IV element, wherein the second Group IV element is a nonsilicon element. The content of the second Group IV element in the second semiconductor compound layers is less than that in the first semiconductor compound layers.

19 Claims, 8 Drawing Sheets

(56) References Cited

U.S. PATENT DOCUMENTS

| | | |
|---|---|---|
| 6,368,926 B1 | 4/2002 | Wu |
| 6,444,591 B1 | 9/2002 | Schuegraf et al. |
| 6,537,370 B1 | 3/2003 | Hernandez et al. |
| 6,544,822 B2 | 4/2003 | Kim et al. |
| 6,605,498 B1 | 8/2003 | Murthy et al. |
| 6,613,695 B2 | 9/2003 | Pomarede et al. |
| 6,621,131 B2 | 9/2003 | Murthy et al. |
| 6,624,068 B2 | 9/2003 | Thakar et al. |
| 6,632,718 B1 | 10/2003 | Grider et al. |
| 6,642,122 B1 | 11/2003 | Yu |
| 6,664,156 B1 | 12/2003 | Ang et al. |
| 6,676,764 B2 | 1/2004 | Joo |
| 6,699,763 B2 | 3/2004 | Grider et al. |
| 6,703,271 B2 | 3/2004 | Yeo et al. |
| 6,777,275 B1 | 8/2004 | Kluth |
| 6,806,151 B2 | 10/2004 | Wasshuber et al. |
| 6,809,402 B1 | 10/2004 | Hopper et al. |
| 6,858,506 B2 | 2/2005 | Chang |
| 6,861,318 B2 | 3/2005 | Murthy et al. |
| 6,864,135 B2 | 3/2005 | Grudowski et al. |
| 6,869,867 B2 | 3/2005 | Miyashita et al. |
| 6,887,751 B2 | 5/2005 | Chidambarrao et al. |
| 6,887,762 B1 | 5/2005 | Murthy et al. |
| 6,891,192 B2 | 5/2005 | Chen et al. |
| 6,930,007 B2 | 8/2005 | Bu et al. |
| 6,946,350 B2 | 9/2005 | Lindert et al. |
| 6,962,856 B2 | 11/2005 | Park et al. |
| 6,972,461 B1 | 12/2005 | Chen et al. |
| 6,991,979 B2 | 1/2006 | Ajmera et al. |
| 6,991,991 B2 | 1/2006 | Cheng et al. |
| 7,037,773 B2 | 5/2006 | Wang et al. |
| 7,060,576 B2 | 6/2006 | Lindert et al. |
| 7,060,579 B2 | 6/2006 | Chidambaram et al. |
| 7,112,495 B2 | 9/2006 | Ko et al. |
| 7,118,952 B2 | 10/2006 | Chen et al. |
| 7,132,338 B2 | 11/2006 | Samoilov et al. |
| 7,169,675 B2 | 1/2007 | Tan et al. |
| 7,183,596 B2 | 2/2007 | Wu et al. |
| 7,202,124 B2 | 4/2007 | Fitzgerald et al. |
| 7,217,627 B2 | 5/2007 | Kim |
| 7,288,822 B1 | 10/2007 | Ting et al. |
| 7,303,999 B1 | 12/2007 | Sriraman et al. |
| 7,335,959 B2 | 2/2008 | Curello et al. |
| 7,410,859 B1 | 8/2008 | Peidous et al. |
| 7,462,239 B2 | 12/2008 | Brabant et al. |
| 7,491,615 B2 | 2/2009 | Wu et al. |
| 7,494,856 B2 | 2/2009 | Zhang et al. |
| 7,494,858 B2 | 2/2009 | Bohr et al. |
| 7,592,231 B2 | 9/2009 | Cheng et al. |
| 7,667,227 B2 | 2/2010 | Shimamune et al. |
| 7,691,752 B2 | 4/2010 | Ranade et al. |
| 7,838,370 B2 | 11/2010 | Mehta et al. |
| 2002/0160587 A1 | 10/2002 | Jagannathan et al. |
| 2002/0182423 A1 | 12/2002 | Chu et al. |
| 2003/0181005 A1 | 9/2003 | Hachimine et al. |
| 2003/0203599 A1 | 10/2003 | Kanzawa et al. |
| 2004/0045499 A1 | 3/2004 | Langdo et al. |
| 2004/0067631 A1 | 4/2004 | Bu et al. |
| 2004/0227164 A1 | 11/2004 | Lee et al. |
| 2005/0070076 A1 | 3/2005 | Dion |
| 2005/0079692 A1 | 4/2005 | Samoilov et al. |
| 2005/0082616 A1 | 4/2005 | Chen et al. |
| 2005/0139231 A1 | 6/2005 | Abadie et al. |
| 2005/0260830 A1 | 11/2005 | Kwon et al. |
| 2005/0280098 A1* | 12/2005 | Shin et al. ............ 257/371 |
| 2005/0285193 A1 | 12/2005 | Lee et al. |
| 2005/0287752 A1 | 12/2005 | Nouri et al. |
| 2006/0051922 A1 | 3/2006 | Huang et al. |
| 2006/0057859 A1 | 3/2006 | Chen |
| 2006/0076627 A1 | 4/2006 | Chen et al. |
| 2006/0088968 A1 | 4/2006 | Shin et al. |
| 2006/0115949 A1 | 6/2006 | Zhang et al. |
| 2006/0138398 A1* | 6/2006 | Shimamune et al. ........ 257/19 |
| 2006/0163558 A1 | 7/2006 | Lee et al. |
| 2006/0228842 A1 | 10/2006 | Zhang et al. |
| 2006/0231826 A1 | 10/2006 | Kohyama |
| 2006/0258126 A1 | 11/2006 | Shiono et al. |
| 2006/0281288 A1 | 12/2006 | Kawamura et al. |
| 2006/0292779 A1 | 12/2006 | Chen et al. |
| 2006/0292783 A1 | 12/2006 | Lee et al. |
| 2007/0023847 A1 | 2/2007 | Rhee et al. |
| 2007/0034906 A1 | 2/2007 | Wang et al. |
| 2007/0049014 A1 | 3/2007 | Chen et al. |
| 2007/0072353 A1 | 3/2007 | Wu et al. |
| 2007/0072376 A1 | 3/2007 | Chen et al. |
| 2007/0082451 A1 | 4/2007 | Samoilov et al. |
| 2007/0128783 A1 | 6/2007 | Ting et al. |
| 2007/0166929 A1 | 7/2007 | Matsumoto et al. |
| 2007/0262396 A1 | 11/2007 | Zhu et al. |
| 2008/0014688 A1 | 1/2008 | Thean et al. |
| 2008/0061366 A1 | 3/2008 | Liu et al. |
| 2008/0067545 A1 | 3/2008 | Rhee et al. |
| 2008/0076236 A1* | 3/2008 | Chiang et al. ............ 438/509 |
| 2008/0085577 A1 | 4/2008 | Shih et al. |
| 2008/0116525 A1 | 5/2008 | Liu et al. |
| 2008/0124874 A1 | 5/2008 | Park et al. |
| 2008/0128746 A1 | 6/2008 | Wang |
| 2008/0142886 A1 | 6/2008 | Liao et al. |
| 2008/0220579 A1 | 9/2008 | Pal et al. |
| 2008/0233722 A1 | 9/2008 | Liao et al. |
| 2008/0233746 A1 | 9/2008 | Huang et al. |
| 2009/0039389 A1 | 2/2009 | Tseng et al. |
| 2009/0045456 A1 | 2/2009 | Chen et al. |
| 2009/0095992 A1 | 4/2009 | Sanuki et al. |
| 2009/0117715 A1 | 5/2009 | Fukuda et al. |
| 2009/0124056 A1 | 5/2009 | Chen et al. |
| 2009/0166625 A1* | 7/2009 | Ting et al. ............ 257/51 |
| 2009/0184402 A1 | 7/2009 | Chen |
| 2009/0186475 A1 | 7/2009 | Ting et al. |
| 2009/0246922 A1 | 10/2009 | Wu et al. |
| 2009/0278170 A1 | 11/2009 | Yang et al. |
| 2009/0302348 A1 | 12/2009 | Adam et al. |
| 2010/0001317 A1 | 1/2010 | Chen et al. |
| 2010/0093147 A1 | 4/2010 | Liao et al. |
| 2013/0126949 A1* | 5/2013 | Liao et al. ............ 257/288 |

\* cited by examiner

METHOD FOR FABRICATING FIRST AND SECOND EPITAXIAL CAP LAYERS

BACKGROUND OF THE INVENTION

1. Field of the Invention

The present invention relates to a metal oxide semiconductor (MOS) device and a method for fabricating the same.

2. Description of Related Art

Metal oxide semiconductor (MOS) transistor is one of the most common elements used in many different semiconductor devices, such as memories, image sensors or displays. A typical MOS includes a silicon oxide dielectric layer, a gate conductive layer, and heavily doped source/drain contact regions. Along with decrease in linewidth of semiconductor devices, dimensions thereof are reduced. Due to the reduction in the gate width of the typical MOS, the channel length of the MOS is consequentially reduced.

As the channel length reduces, applying mechanical stress to the channel is proposed to effectively change mobility of electrons and holes in the channel, thereby increasing operating speed of the transistor. A conventional technique has been provided with using silicon germanium (SiGe) epitaxy material as a major component of the source/drain contact regions in the transistor. As compared with characteristics of silicon material, germanium has larger atomic volume and can apply a compressive stress toward the channel. Thus, the mobility of the holes can be enhanced in the source/drain contact regions majorly made of silicon germanium (SiGe), and thereby device performance can be improved.

In the fabrication process of the device, an epitaxial growth rate of silicon germanium (SiGe), however, varies in accordance with different density of surrounding patterns of the device to be formed. Accordingly, the thickness of the resultant silicon germanium (SiGe) is non-uniform (i.e. so-called loading effects), and issues regarding mismatches of the device performance arise therefrom.

SUMMARY OF THE INVENTION

The present invention is directed to a MOS device, capable of enhancing turn-on currents and lessening turn-off currents, so that the mismatches of the device performance can be ameliorated.

The present invention is directed to a method for fabricating a MOS device, wherein alterations in the fabrication process can achieve enhancement of the turn-on currents, decrease in the turn-off currents, and improvement in the mismatches of the device performance.

A method for fabricating a MOS device of the present invention is described as follows. Two recesses are formed in a substrate. A first epitaxy growth process is performed, so as to form a first semiconductor compound layer in each of the recesses. A second epitaxy growth process is performed with an epitaxial temperature lower than 700° C., so as to form a cap layer on each of the first semiconductor compound layers. Each of the cap layers includes a second semiconductor compound layer protruding from a surface of the substrate. The first and the second semiconductor compound layers are composed of a first Group IV element and a second Group IV element, wherein the second Group IV element is a nonsilicon element. The content of the second Group IV element in the second semiconductor compound layers is less than that in the first semiconductor compound layers.

According to an embodiment of the present invention, an included angle between each of the second semiconductor compound layers and the surface of the substrate is less than 40°.

According to an embodiment of the present invention, the second semiconductor compound layers have a (311) facet.

According to an embodiment of the present invention, the first semiconductor compound layers and the second semiconductor compound layers contain dopants therein, and a dopant concentration in the second semiconductor compound layers is equal to or lower than a dopant concentration in the first semiconductor compound layers.

According to an embodiment of the present invention, the epitaxial temperature of the second epitaxy growth process ranges between 650° C. and 680° C.

According to an embodiment of the present invention, an epitaxial temperature of the first epitaxy growth process ranges between 630° C. and 660° C.

According to an embodiment of the present invention, the method further includes performing a third epitaxy growth process before performing the first epitaxy growth process, so as to form a buffer layer in each of the recesses. Each of the buffer layers includes a semiconductor compound layer having a dopant concentration equal to 0 or lower than a dopant concentration in the first semiconductor compound layers.

According to an embodiment of the present invention, the first epitaxy growth process finishes when a top of the first semiconductor compound layers protrudes from the surface of the substrate by 50 Å to 100 Å.

Another method for fabricating a MOS device of the present invention is described as follows. Two recesses are formed in a substrate. A first epitaxy growth process is performed, so as to form a first semiconductor compound layer in each of the recesses. A second epitaxy growth process is performed, so as to form a second semiconductor compound layer on each of the first semiconductor compound layers. The second semiconductor compound layers protrude from a surface of the substrate. The first and the second semiconductor compound layers are composed of a first Group IV element and a second Group IV element, wherein the second Group IV element is a nonsilicon element. The content of the second Group IV element in the second semiconductor compound layers is less than that in the first semiconductor compound layers. The second epitaxy growth process includes a first growth stage and a second growth stage, wherein a growth rate of the second growth stage is less than a growth rate of the first growth stage.

According to an embodiment of the present invention, the growth rate of the second epitaxy growth process is less than 80 Å/100 sec.

According to an embodiment of the present invention, the growth rate of the first growth stage is at least 2 times of the growth rate of the second growth stage in the second epitaxy growth process.

According to an embodiment of the present invention, an included angle between each of the second semiconductor compound layers and the surface of the substrate is less than 40°.

According to an embodiment of the present invention, the second semiconductor compound layers have a (311) facet.

According to an embodiment of the present invention, the first semiconductor compound layers and the second semiconductor compound layers contain dopants therein, and a dopant concentration in the second semiconductor compound layers is equal to or lower than a dopant concentration in the first semiconductor compound layers.

According to an embodiment of the present invention, the method further includes performing a third epitaxy growth process before performing the first epitaxy growth process, so as to form a buffer layer in each of the recesses. Each of the buffer layers includes a semiconductor compound layer having a dopant concentration equal to 0 or lower than a dopant concentration in the first semiconductor compound layers.

According to an embodiment of the present invention, the first epitaxy growth process finishes when a top of the first semiconductor compound layers protrudes from the surface of the substrate by 50 Å to 100 Å.

A MOS device of the present invention is provided, including a substrate, first semiconductor compound layers, and cap layers. The substrate has two recesses therein. The first semiconductor compound layers are disposed in the recesses. Each of the cap layers includes a second semiconductor compound layer that is disposed on each of the first semiconductor compound layers and protrudes from a surface of the substrate. An included angle between each of the second semiconductor compound layers and the surface of the substrate is less than 40°.

According to an embodiment of the present invention, the second semiconductor compound layers have a (311) facet.

According to an embodiment of the present invention, the first semiconductor compound layers and the second semiconductor compound layers contain dopants therein, and a dopant concentration in the second semiconductor compound layers is equal to or lower than a dopant concentration in the first semiconductor compound layers.

According to an embodiment of the present invention, the MOS device further includes buffer layers, respectively disposed in the recesses and intervening between the substrate and the first semiconductor compound layers. Each of the buffer layers includes a semiconductor compound layer having a dopant concentration equal to 0 or lower than a dopant concentration in the first semiconductor compound layers.

According to an embodiment of the present invention, a top of the first semiconductor compound layers protrudes from the surface of the substrate by 50 Å to 100 Å.

According to an embodiment of the present invention, a thickness of the cap layers is 1/X to 1/Y times of a thickness of the first semiconductor compound layers.

As mentioned above, the MOS device in this invention can enhance the turn-on currents and lessen the turn-off currents, thereby improving the mismatches of the device performance. Moreover, the fabricating method of the MOS device in this invention is capable of enhancing the turn-on currents, lessening the turn-off currents, and improving the mismatches of the device performance through modifications in the fabrication process.

In order to make the aforementioned and other features and advantages of the present invention more comprehensible, preferred embodiments accompanied with figures are described in detail below.

BRIEF DESCRIPTION OF THE DRAWINGS

The patent or application file contains at least one drawing executed in color. Copies of this patent or patent application publication with color drawings will be provided by the Office upon request and payment of the necessary fee. The accompanying drawings are included to provide a further understanding of the invention, and are incorporated in and constitute a part of this specification. The drawings illustrate embodiments of the invention, and, together with the description, serve to explain the principles of the invention.

DESCRIPTION OF THE EMBODIMENTS

Figure 1:
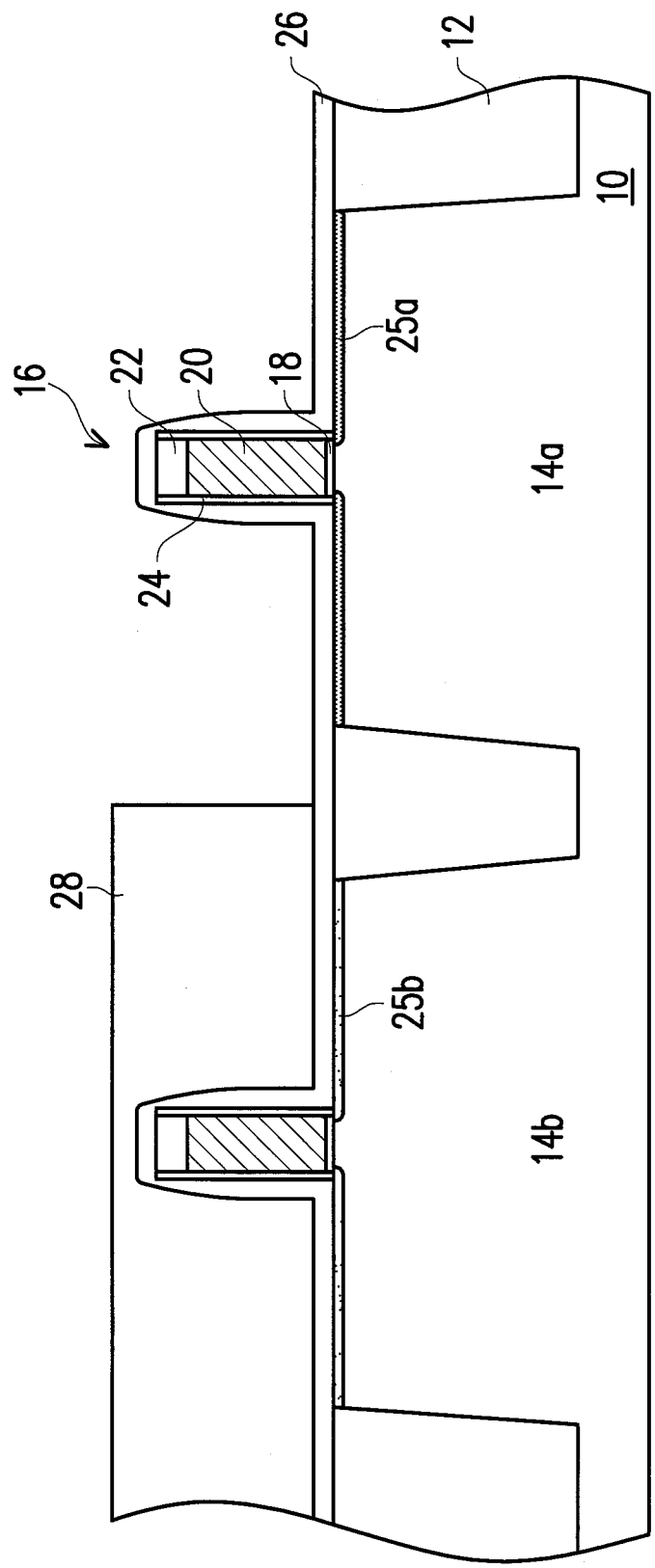
FIGS. 1-7 depict, in a cross-sectional view, a method for fabricating a MOS device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1-7 depict, in a cross-sectional view, a method for fabricating a MOS device according to an embodiment of the present invention.

Referring to FIG. 1, isolation structures 12 are formed in a substrate 10, so as to define a first active area 14a and a second active area 14b. The material of the substrate 10 includes semiconductor, such as silicon. The material of the isolation structures 12 includes insulating material, such as silicon oxide. The isolation structures 12 are, for example, formed by a shallow trench isolation (STI) method.

Stack structures are then formed on the first and the second active areas 14a, 14b of the substrate 10, respectively. Each stack structure 16 includes an insulating layer 18, a conductor layer 20 and a hard mask layer 22. In an embodiment, a width of the stack structures 16 is, for example, about 24 nm. The insulating layers 18 may include a dielectric layer, a high-dielectric constant (K value greater than 4) material, a barrier layer, or combination thereof. The dielectric layer is, for example, made of silicon oxide. The high-K dielectric material is, for example, hafnium oxide ($HfO_2$), hafnium silicon oxide (HfSiO), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), or hafnium zirconium oxide (HfZrO). The barrier layer is, for example, made of titanium (Ti), tantalum (Ta), titanium nitride (TiN), tantalum nitride (TaN), or combination thereof. The material of the conductor layers 20 can be monocrystalline silicon, undoped polysilicon, doped polysilicon, amorphous silicon, silicon germanium material, or combination thereof with a thickness of, for example, about 650 Å. The material of the hard mask layers 22 can be silicon oxide, silicon nitride, silicon carbide or silicon oxynitride with, for example, hundreds of angstroms in thickness. The formation of the stack structures 16 can be carried out by forming an insulating material layer, a conductor material layer and a hard mask material layer, and then patterning the foregoing layers through lithography and etching processes.

Afterwards, first spacers 24 are formed on respective sidewalls of each stack structure 16. The material of the first spacers 24 are, for example, silicon nitride. Then, ion implantation processes are conducted individually, so that a lightly doped drain (LDD) 25a and an LDD 25b are formed respectively in the first active area 14a and in the second active area 14b. In an embodiment, when a PMOS device is to be formed on the first active area 14a, dopants implanted into the LDD 25a may be P-type; when an NMOS is to be formed on the second active area 14b, dopants implanted into the LDD 25b may be N-type. In another embodiment, when the NMOS device is to be formed on the first active area 14a, dopants implanted into the LDD 25a may be N-type; when the PMOS device is to be formed on the second active area 14b, dopants implanted into the LDD 25b may be P-type. The P-type dopants can be boron or $BF_2^+$, while the N-type dopants can be phosphorous or arsenic.

Subsequently, a block layer 26 is formed on the substrate 10. The block layer 26 is, for example, made of silicon nitride. A mask layer 28 is then formed on the first active area 14a. The mask layer 28 is, for example, made of photoresist, and the formation thereof can be implemented by the lithography process.

Figure 2:
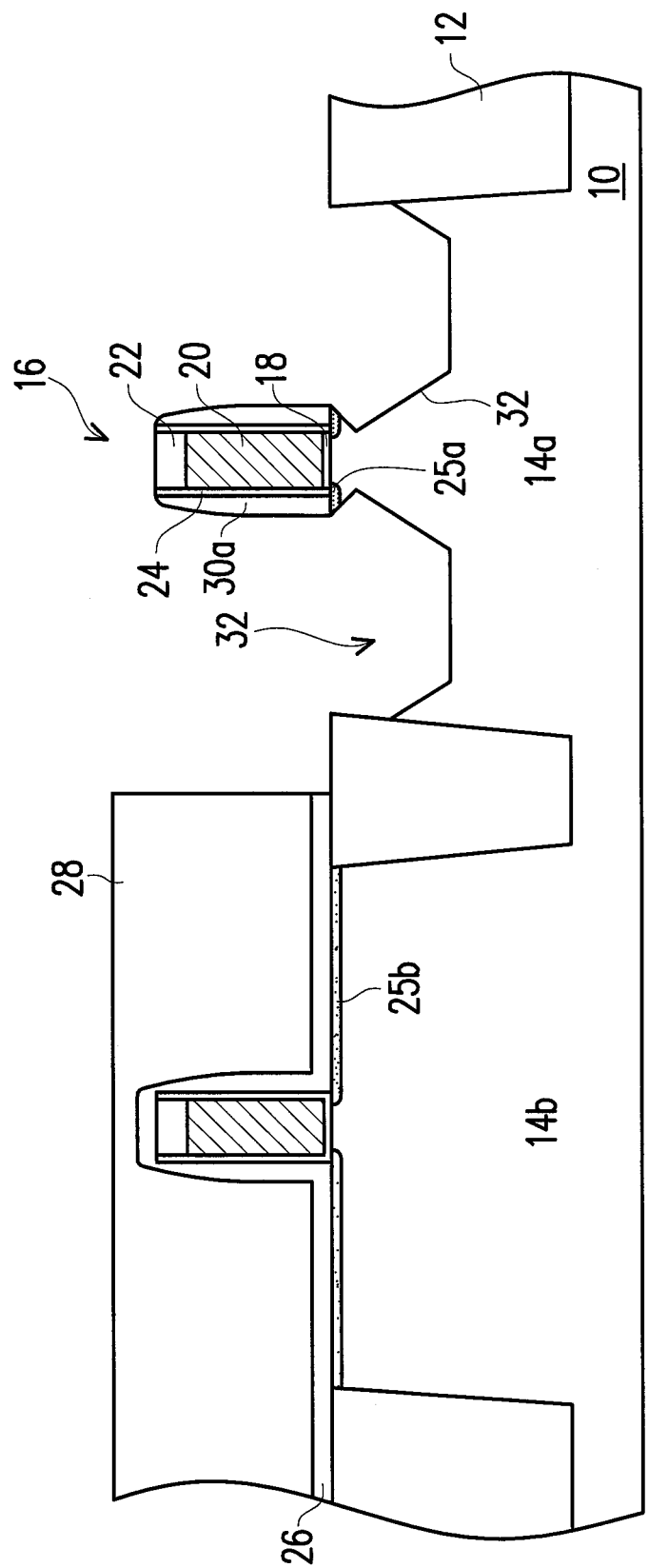

Referring to FIG. 2, an anisotropic etching process is performed using the mask layer 28 as an etching mask, and thus, a portion of the block layer 26 is removed, so as to form second spacers 30a on the respective sidewalls of the stack structure 16 on the first active area 14a.

Afterwards, a portion of the substrate 10 in the first active area 14a is removed by dry or wet etching or combination thereof, so that two recesses 32 are formed in the substrate 10 at both sides of the second spacers 30a. In an embodiment, a depth of each recess 32 is, for example, about hundreds of angstroms. The recesses 32 can have diamond-shaped profiles or rectangle-shaped profiles, and are not particularly limited by the present invention.

Figure 3:
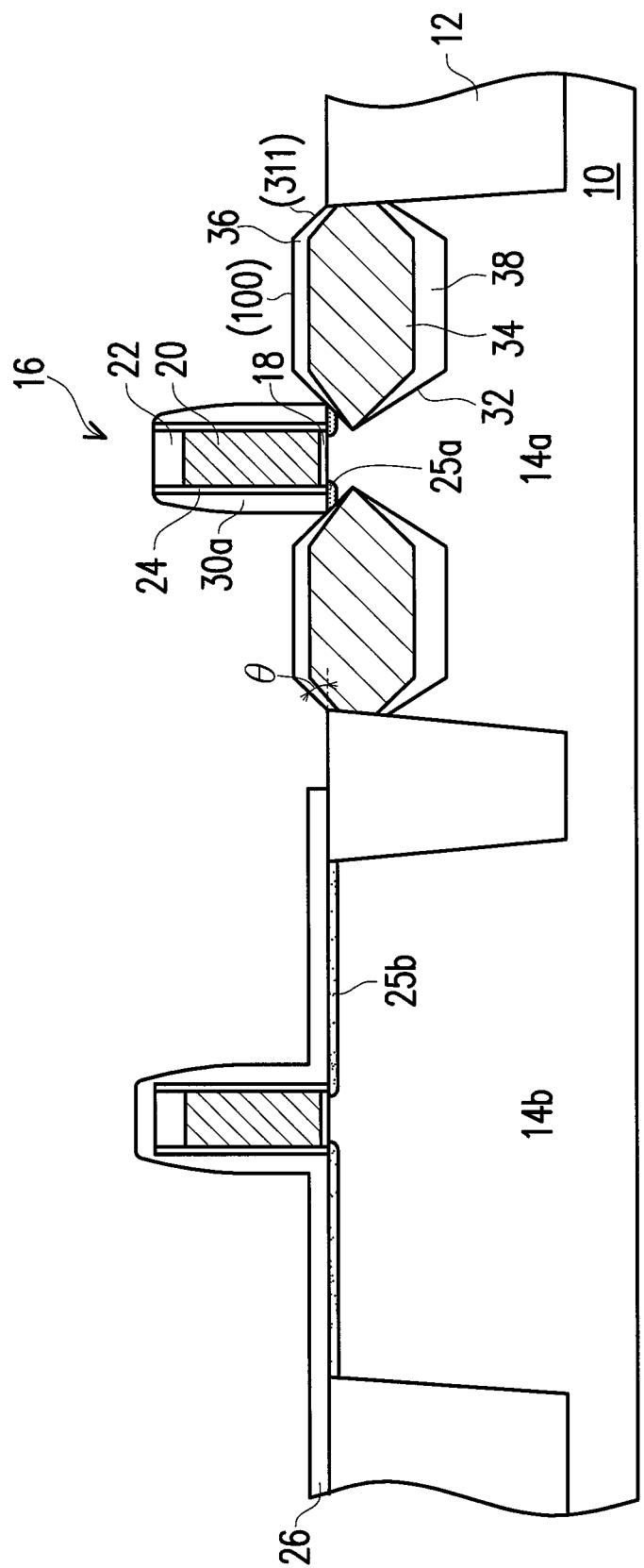

Referring to FIG. 3, the mask layer 28 is removed, so that the block layer 26 on the second active area 14b is exposed.

A semiconductor compound layer 33 is then formed in each of the recesses 32. The fabricating method of the semiconductor compound layers 33 includes performing a first epitaxy growth process to form a first semiconductor compound layer 34 in each recess 32, and then performing a second epitaxy growth process to form a cap layer 36 on each first semiconductor compound layer 34. Each cap layer 36 includes a second semiconductor compound layer that may protrude from the surface of the substrate 10. Before conducting the first epitaxy growth process, thermal annealing can be optionally performed in a hydrogen ambiance.

The first and the second semiconductor compounds described herein are, for example, IV-IV semiconductor compounds. The IV-IV semiconductor compounds can be composed of a first Group N element and a second Group IV element. The first Group IV element is, for example, silicon (Si). The second Group N element is, for example, a nonsilicon element, such as germanium (Ge) or carbon (C). In other words, the IV-IV semiconductor compounds can be silicon germanium (SiGe) or silicon carbide (SiC). In the PMOS device, the material of the first semiconductor compound layers 34 and the second semiconductor compound layers may be silicon germanium (SiGe); in the NMOS device, the material of the first semiconductor compound layers 34 and the second semiconductor compound layers may be silicon carbide (SiC).

The content of the second Group IV element (e.g. germanium content or carbon content) in the second semiconductor compound layers is less than that of the second Group N element (e.g. germanium content or carbon content) in the first semiconductor compound layers 34. The first semiconductor compound layers 34 and the second semiconductor compound layers of the cap layers 36 have dopants contained therein, and the dopant concentration in the second semiconductor compound layers of the cap layers 36 is equal to or lower than that in the first semiconductor compound layer 34. In the PMOS device, the first semiconductor compound layers 34 and the second semiconductor compound layers are doped with the P-type dopants, e.g. boron or $BF_2^+$; in the NMOS device, the first semiconductor compound layers 34 and the second semiconductor compound layers are doped with the N-type dopants, e.g. phosphorous or arsenic.

In an embodiment, when the semiconductor compound is silicon germanium (SiGe), reactant gas utilized in the epitaxy growth processes includes a silicon source and a germanium source. The epitaxial temperatures of the first epitaxy growth process and the second epitaxy growth process are lower than 700° C. Owing to the relatively low epitaxial temperatures of the first and the second epitaxy growth processes, outward diffusion of the dopants in the first semiconductor compound layers 34 and in the second semiconductor compound layers can be significantly mitigated.

In an embodiment, the epitaxial temperature of the second epitaxy growth process may range between 650° C. and 680° C., and the epitaxial temperature of the first epitaxy growth process may range between 630° C. and 660° C. In other words, the epitaxial temperature of the second epitaxy growth process is slightly higher than that of the first epitaxy growth process by about 10° C. to tens of degrees Celsius, but the epitaxial temperature of the second epitaxy growth process is still lower than 700° C.

Figure 8:
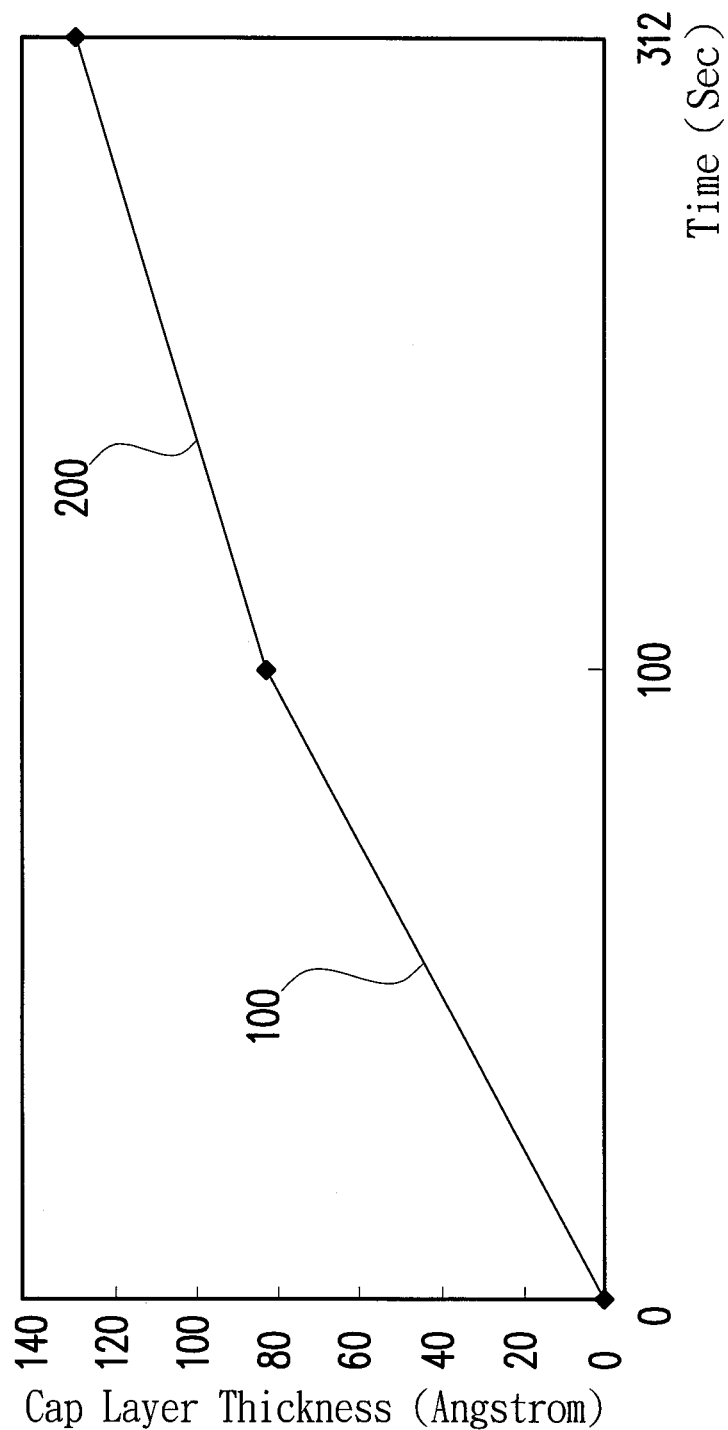
FIG. 8 illustrates a second epitaxy growth process for formation of cap layers according to an embodiment of the present invention.

Referring to FIG. 8, the second epitaxy growth process for the formation of the cap layers 36 includes a first growth stage 100 and a second growth stage 200. The first growth stage 100 has a faster growth rate, while the second growth stage 200 has a slower growth rate. The growth rate of the first growth stage 100 is, for example, about 80 Å/100 sec. The growth rate of the second growth stage 200 is, for example, less than 80 Å/100 sec, possibly about 38 Å/100 sec to 40 Å/100 sec. The growth rate of the first growth stage 100 is at least 2 times of that of the second growth stage 200. During the first growth stage 100, the cap layers 36 grow at the faster rate until the cap layers 36 arrive at a given thickness. Thereafter, the second growth stage 200 is performed with the slower growth rate. Therefore, in case a wafer has a first area and a second area, wherein the semiconductor compound grows at the faster rate in the first area, and the semiconductor compound grows at the slower rate in the second area. After the semiconductor compound in the first area of the wafer grows at the faster growth rate during the first growth stage and then reaches the given thickness, the second growth stage is performed with the slower growth rate. As the semiconductor compound in the first area grows at the slower growth rate during the second growth stage, the second area of the wafer, in which the semiconductor compound grows at the slower rate, still undergoes the first growth stage with the faster rate. After the cap layers 36 in the second area reach the given thickness, the second growth stage is performed. Due to the slow growth rate of the second growth stage, the thickness of the semiconductor compound formed in the first area is relatively thin during the second growth stage, which has a tiny difference from the thickness of the semiconductor compound formed in the second area. Accordingly, the loading effects of the first and the second areas can be alleviated in the present invention, thereby improving the mismatches of the device performance. It is substantiated by experiments that the mismatches of the device performance can be better improved by at least 6%.

When the first epitaxy growth process finishes, the top of the resultant first semiconductor compound layers 34 may protrude from the surface of the substrate 10 by 50 Å to 100 Å. When the second epitaxy growth process finishes, the second semiconductor compound layers of the resultant cap layers 36 reach tens of angstroms to hundreds of angstroms in thickness.

In an embodiment, as the semiconductor compound is silicon germanium (SiGe), an included angle between the second semiconductor compound layer of the cap layers 36 and the surface of the substrate 10 is less than 40°, for example about 25°. In an embodiment, as the semiconductor compound is silicon germanium (SiGe), the second semiconductor compound layers in the lateral of the cap layers 36 may have a (311) facet, and the second semiconductor compound layers in the upper surface of the cap layers may have a (100) facet.

In another embodiment, the formation of the semiconductor compound layers 33 further includes performing a third epitaxy growth process before the first epitaxy growth process is performed, so as to form a buffer layer 38 in each recess 32. Each buffer layer 38 includes a third semiconductor compound layer, and a dopant concentration therein equal to 0 or lower than that in the first semiconductor compound layers 34. In the PMOS device, the buffer layers 38 are doped with the P-type dopants, such as boron or $BF_2^+$. In the NMOS device, the buffer layers 38 are doped with the N-type dopants, such as phosphorous or arsenic.

In the PMOS device at 40 nm process node, the semiconductor compound layers of the first semiconductor compound layers 34, the second semiconductor compound layers 36 and the buffer layers 38 are silicon germanium (SiGe). The germanium content in the semiconductor compound layers of the buffer layers 38 is, for example, about 22-25%; the germanium content in the first semiconductor compound layers 34 is, for example, about 28%; and the germanium content in the second semiconductor compound layers of the cap layers 36 is, for example, about 8%. A boron-doped content in the semiconductor compound layers of the buffer layers 38 is, for example, about 0%; a boron-doped content in the first semiconductor compound layers 34 is, for example, about $2\times10^{20}/cm^2$; and a boron-doped content in the second semiconductor compound layers of the cap layers 36 is, for example, about $7\times10^{19}/cm^2$ to $2\times10^{20}/cm^2$. It is verified, in this invention, by experiments that the turn-on currents (Ion) can be enhanced by 2%, and the turn-off currents (Ioff) can be diminished, thereby the mismatches of the device performance can be ameliorated by 6% or above.

The foregoing first semiconductor compound layers 34, the foregoing cap layers (the second semiconductor compound layers) 36 and the foregoing buffer layers 38 can be formed by conducting the epitaxy growth processes in the same reaction chamber, wherein the silicon germanium (SiGe) (or silicon carbide (SiC)) with various germanium content (or carbon content) is formed by adjusting the ratio of the silicon source and the germanium source in the reactant gas (or the ratio of the silicon source and the carbon source in the reactant gas). In addition, in-situ doping is conducted during the epitaxy growth processes.

Figure 4:
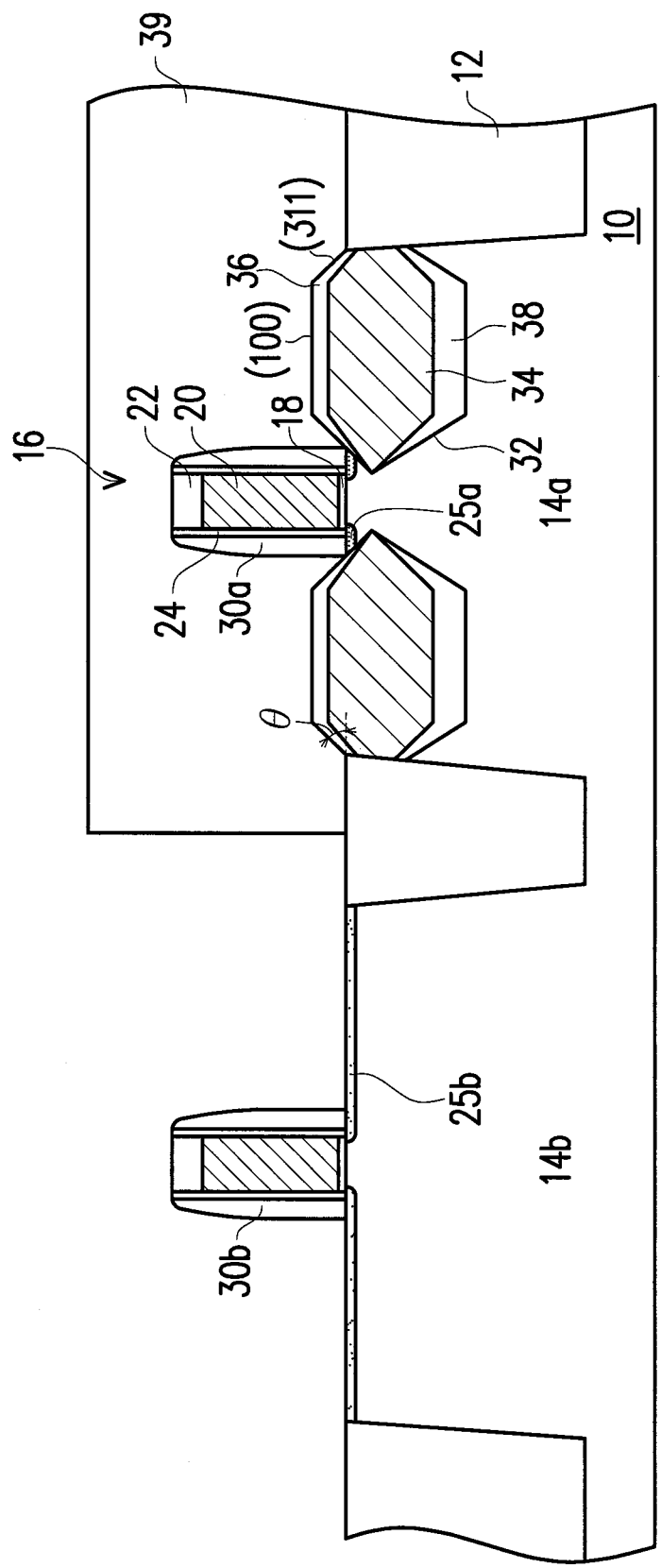

Referring to FIG. 4, another mask layer 39 is formed on the first active area 14a. Afterwards, the block layer 26 on the second active area 14b is anisotropically etched, so as to form second spacers 30b on the second active area 14b.

Figure 5:
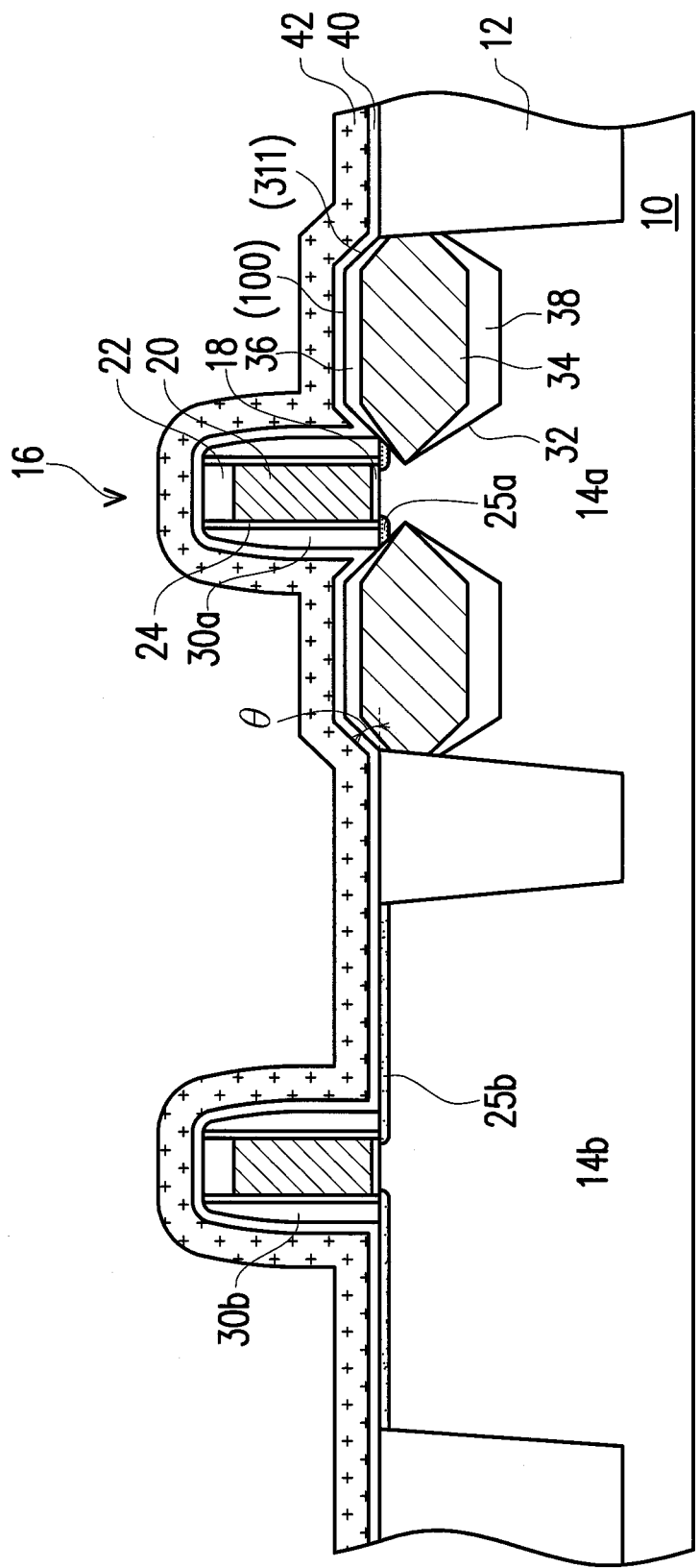

Referring to FIG. 5, the mask layer 39 is removed. A spacer material layer 40 and a spacer material layer 42 are then formed on the substrate 10. The material of the spacer material layer 40 is different from that of the spacer material layers 42. In an embodiment, the material of the spacer material layer 40 may be silicon oxide, while the material of the spacer material layers 42 may be silicon nitride.

Figure 6:
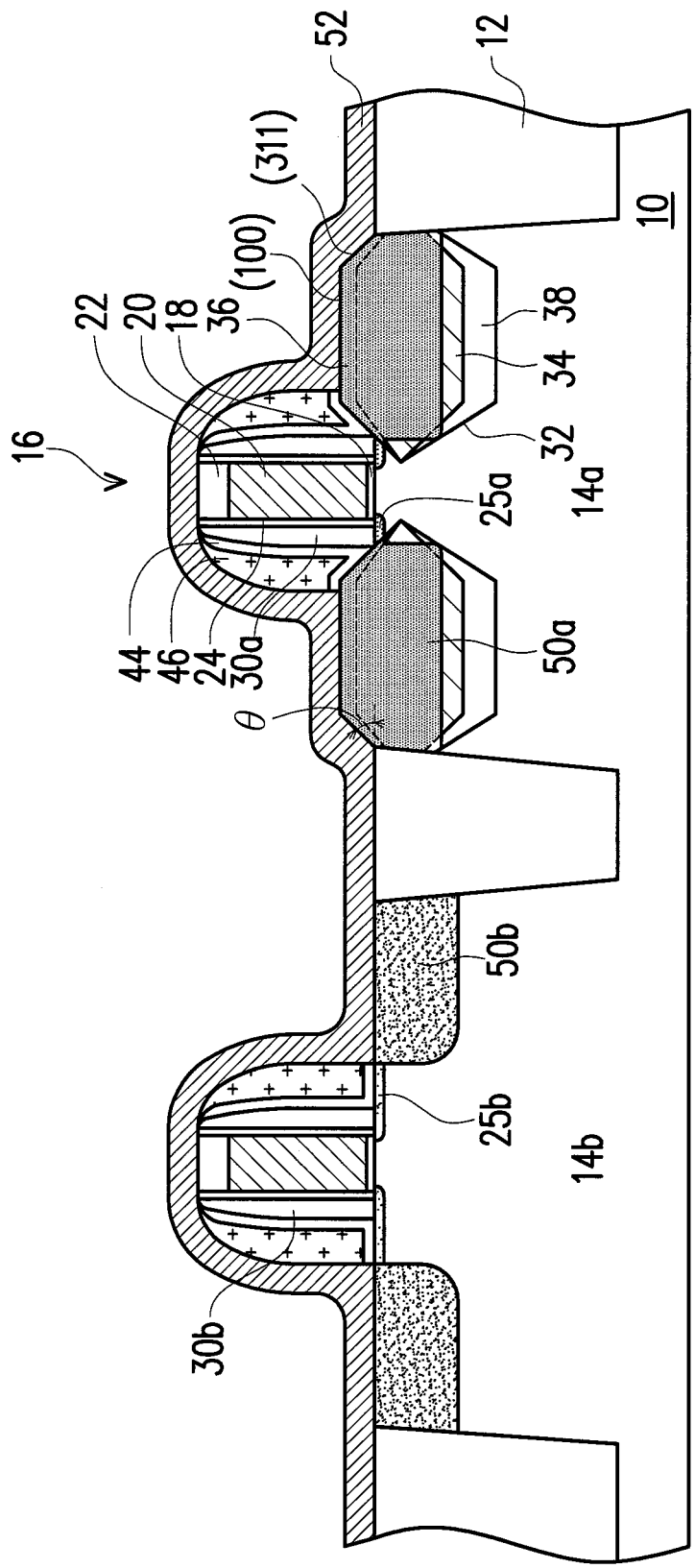

Referring to FIG. 6, the spacer material layers 40 and 42 are etched in an anisotropic manner, so that third spacers 44 and fourth spacers 46 are respectively formed. Thereafter, ion implantation processes are performed to implant dopants respectively into the semiconductor compound layers 33 of the first active area 14a and into the substrate 10 of the second active area 14b, such that source and drain regions 50a and source and drain regions 50b are respectively formed. In an embodiment, when the PMOS device is to be formed on the first active area 14a, the source and drain regions 50a are implanted with the P-type dopants; when the NMOS device is to be formed on the second active area 14b, the source and drain regions 50b are implanted with the N-type dopants. In another embodiment, when the NMOS device is to be formed on the first active area 14a, the source and drain regions 50a are implanted with the N-type dopants; when the PMOS device is to be formed on the second active area 14b, the source and drain regions 50b are implanted with the P-type dopants. The P-type dopants can be boron or $BF_2^+$, and the N-type dopants can be phosphorous or arsenic.

A metal layer 52 is then formed on the substrate 10. The material of the metal layer 52 includes refractory metal, e.g. nickel (Ni), titanium (Ti), tungsten (W), cobalt (Co), platinum (Pt) or palladium (Pd).

Figure 7:
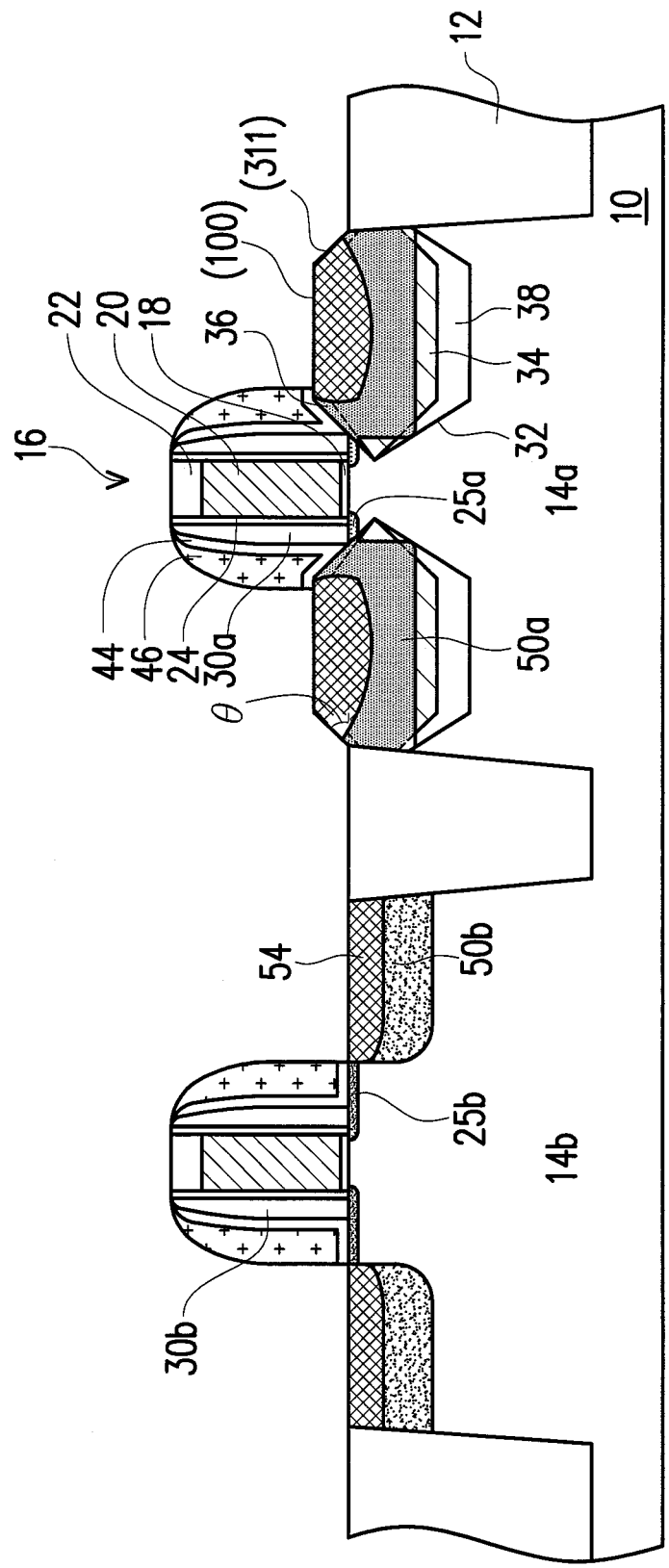

Referring to FIG. 7, a thermal process is performed, such that the metal layer 52 may react with silicon in the substrate 10 to form metal silicide layers 54. The metal silicide layers 54 can be made of nickel silicide, titanium silicide, tungsten silicide, cobalt silicide, platinum silicide or palladium silicide.

In view of the above, the present invention is carried out by growing the semiconductor compounds of the source and drain regions through the first and the second epitaxy growth processes with the relatively low epitaxial temperatures, and the outward diffusion of the dopants in the resultant first and second semiconductor compound layers can be alleviated. In addition, the second semiconductor compound layers formed by this fabrication process have an included angle with the surface of the substrate less than 40°, which can enhance the turn-on currents and lessen the turn-off currents of the MOS device, so that the improvement in the mismatches of the device performance can be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a metal oxide semiconductor (MOS) device, comprising:
    forming two recesses in a substrate;
    performing a first epitaxy growth process, so as to form a first semiconductor compound layer in each of the recesses; and
    performing a second epitaxy growth process with an epitaxial temperature lower than 700, so as to form a cap layer on each of the first semiconductor compound layers, each of the cap layers comprising a second semiconductor compound layer that protrudes from a surface of the substrate, wherein the first semiconductor compound layers and the second semiconductor compound layers are composed of a first Group IV element and a second Group IV element that is a nonsilicon element, and a content of the second Group IV element in the second semiconductor compound layers is less than a content of the second Group IV element in the first semiconductor compound layers, and an included angle between a top surface of each of the second semiconductor compound layers and the surface of the substrate is less than 40°.

2. The method according to claim 1, wherein the second semiconductor compound layers have a (311) facet.

3. The method according to claim 1, wherein the first semiconductor compound layers and the second semiconductor compound layers comprise dopants, and a dopant concentration in the second semiconductor compound layers is equal to or lower than a dopant concentration in the first semiconductor compound layers.

4. The method according to claim 1, wherein the epitaxial temperature of the second epitaxy growth process ranges between 650° C. and 680° C.

5. The method according to claim 4, wherein an epitaxial temperature of the first epitaxy growth process ranges between 630° C. and 660° C.

6. The method according to claim 1, further comprising performing a third epitaxy growth process before performing the first epitaxy growth process, so as to form a buffer layer in each of the recesses, wherein each of the buffer layers comprises a semiconductor compound layer having a dopant concentration equal to 0 or lower than a dopant concentration in the first semiconductor compound layers.

7. The method according to claim 1, wherein the first epitaxy growth process finishes when a top of the first semiconductor compound layers protrudes from the surface of the substrate by 50 Å to 100 Å.

8. A method for fabricating a metal oxide semiconductor (MOS) device, comprising:
    forming two recesses in a substrate;
    performing a first epitaxy growth process, so as to form a first semiconductor compound layer in each of the recesses; and
    performing a second epitaxy growth process, so that a second semiconductor compound layer is formed on each of the first semiconductor compound layers, and the second semiconductor compound layers protrude from a surface of the substrate, wherein the first semiconductor compound layers and the second semiconductor compound layers are composed of a first Group IV element and a second Group IV element that is a nonsilicon element, and a content of the second Group IV element in the second semiconductor compound layers is less than a content of the second Group IV element in the first semiconductor compound layers, an included angle between a top surface of each of the second semiconductor compound layers and the surface of the substrate is less than 40°, and the second epitaxy growth process comprising:
    a first growth stage; and
    a second growth stage, wherein a growth rate of the second growth stage is less than a growth rate of the first growth stage.

9. The method according to claim 8, wherein the growth rate of the second epitaxy growth process is less than 80 Å/100 sec.

10. The method according to claim 8, wherein the growth rate of the first growth stage is at least 2 times of the growth rate of the second growth stage.

11. The method according to claim 8, wherein the second semiconductor compound layers have a (311) facet.

12. The method according to claim 8, wherein the first semiconductor compound layers and the second semiconductor compound layers comprise dopants, and a dopant concentration in the second semiconductor compound layers is equal to or lower than a dopant concentration in the first semiconductor compound layers.

13. The method according to claim 8, further comprising performing a third epitaxy growth process before performing the first epitaxy growth process, so as to form a buffer layer in each of the recesses, wherein each of the buffer layers comprises a semiconductor compound layer having a dopant concentration equal to 0 or lower than a dopant concentration in the first semiconductor compound layers.

14. The method according to claim 8, wherein the first epitaxy growth process finishes when a top of the first semiconductor compound layers protrudes from the surface of the substrate by 50 Å to 100 Å.

15. A metal oxide semiconductor (MOS) device, comprising:
    a substrate, having two recesses therein;
    a first semiconductor compound layer, disposed in each of the recesses; and
    a cap layer comprising a second semiconductor compound layer, disposed on each of the first semiconductor compound layers and protruding from a surface of the substrate, wherein an included angle between each of a top surface of the second semiconductor compound layers and the surface of the substrate is less than 40°.

16. The MOS device according to claim 15, wherein the second semiconductor compound layers have a (311) facet.

17. The MOS device according to claim 15 wherein the first semiconductor compound layers and the second semiconductor compound layers comprise dopants, and a dopant concentration in the second semiconductor compound layers is equal to or lower than a dopant concentration in the first semiconductor compound layers.

18. The MOS device according to claim 15, further comprising a buffer layer, disposed in each of the recesses and intervening between the substrate and the first semiconductor compound layers, wherein each of the buffer layers comprises a semiconductor compound layer having a dopant concentration equal to 0 or lower than a dopant concentration in the first semiconductor compound layers.

19. The MOS device according to claim 15, wherein a top of the first semiconductor compound layers protrudes from the surface of the substrate by 50 Å to 100 Å.

* * * * *